(12) United States Patent
Wiedemuth et al.

(10) Patent No.: US 7,508,093 B2
(45) Date of Patent: Mar. 24, 2009

(54) MODULAR CURRENT SUPPLY

(75) Inventors: Peter Wiedemuth, Herbikzheim (DE); Stefan Schirmaier, Freiburg (DE); Markus Winterhalter, Bad Krozingen (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 479 days.

(21) Appl. No.: 10/743,345

(22) Filed: Dec. 23, 2003

(65) Prior Publication Data

US 2004/0165324 A1 Aug. 26, 2004

(30) Foreign Application Priority Data

Dec. 23, 2002 (DE) .............. 102 60 726

(51) Int. Cl.
*H02J 1/10* (2006.01)
(52) U.S. Cl. .................... 307/44; 307/147
(58) Field of Classification Search ........... 363/69, 363/67; 307/18, 19, 32, 45, 58, 44, 147
See application file for complete search history.

(56) References Cited

U.S. PATENT DOCUMENTS

| | | | | |
|---|---|---|---|---|
| 4,992,925 A | * | 2/1991 | Meyer | 363/141 |
| 5,532,935 A | * | 7/1996 | Ninomiya et al. | 700/296 |
| 5,616,968 A | * | 4/1997 | Fujii et al. | 307/66 |
| 5,675,480 A | * | 10/1997 | Stanford | 307/58 |
| 5,694,312 A | * | 12/1997 | Brand et al. | 363/144 |
| 5,764,504 A | * | 6/1998 | Brand et al. | 363/144 |
| 5,815,388 A | * | 9/1998 | Manley et al. | 363/63 |
| 5,828,356 A | * | 10/1998 | Stoller | 345/60 |
| 6,166,455 A | * | 12/2000 | Li | 307/43 |
| 6,191,500 B1 | * | 2/2001 | Toy | 307/64 |
| 6,211,581 B1 | * | 4/2001 | Farrant | 307/117 |
| 6,362,540 B1 | * | 3/2002 | Hill | 307/52 |
| 6,674,274 B2 | * | 1/2004 | Hobrecht et al. | 323/285 |
| 6,700,332 B2 | * | 3/2004 | Yokozeki et al. | 315/248 |
| 7,061,139 B2 | * | 6/2006 | Young et al. | 307/45 |

(Continued)

FOREIGN PATENT DOCUMENTS

DE 19546495 6/1997

(Continued)

OTHER PUBLICATIONS

Optima® DCG-600 DC Plasma Generator 60kW DC Power for Plasma Applications specification, published at http://www.mksinst.com/cgi-bin/product.exe?pid=dcg-600 (viewed on Jan. 21, 2004).

(Continued)

*Primary Examiner*—Stephen W Jackson
*Assistant Examiner*—Daniel Cavallari
(74) *Attorney, Agent, or Firm*—Fish & Richardson P.C.

(57) ABSTRACT

A current supply system includes one or more, or a plurality of current supply modules that each includes an input terminal and an output terminal and that each has a maximum output power. Multiple current supply modules are electrically combined to form a current supply unit having a maximum output power that is greater than the maximum output power of the individual current supply modules, and a control unit is connected to the current supply unit. A data connection connects the control unit to all the current supply modules of the current supply unit.

51 Claims, 3 Drawing Sheets

U.S. PATENT DOCUMENTS

2003/0111909 A1* 6/2003 Liu et al. .................. 307/64
2004/0000815 A1* 1/2004 Pereira ..................... 307/11
2004/0208029 A1* 10/2004 Caruthers et al. ......... 363/72

FOREIGN PATENT DOCUMENTS

| DE | 19600367 | 7/1997 |
| DE | 10018879 | 10/2001 |
| EP | 06 69 653 | 8/1995 |
| EP | 0 809 347 A2 | 11/1997 |
| EP | 1 248 343 A2 | 1/2002 |

OTHER PUBLICATIONS

Search report from corresponding German application serial No. 102 60 726.5, Mar. 14, 2007, 4 pages.

* cited by examiner

MODULAR CURRENT SUPPLY

CROSS-REFERENCE TO RELATED APPLICATIONS

This application claims the benefit of the filing date of German application No. 102 60 726.5, filed on Dec. 23, 2002, which is incorporated herein by reference in its entirety and for all purposes.

TECHNICAL FIELD

The disclosure relates to a current supply system, and more particularly to a modular current supply.

BACKGROUND

Current supply systems for plasma plants or plasma applications (e.g., plasma gas discharges, used in, for example, plasma etching processes and plasma deposition processes) can be located in a switch cabinet. Typically, several current supply modules are disposed in a switch cabinet, and separate current supply modules can be combined into a current supply unit, to achieve a desired output power from the unit. The combination of separate modules into a single unit may be necessary because a single supply system often must separately supply several plasma gas discharge stations of an apparatus with current. The desired output power for each discharge station can be defined by a user, and the current supply modules are cabled together by a system engineer according to the user's wishes. Therefore, the terminals of the current supply modules are connected into a neutral point on the input side of the modules as well as on the output side of the modules. Each module includes a control unit that is connected to an external control unit. A change in the arrangement of the modules that make up a current supply unit of the art is expensive, because the entire cabling must be detached and rearranged, and the control of the unit must be reconfigured. Furthermore, equipping all the current supply modules with a control unit is expensive.

An interlock circuit can be provided to the switch cabinet containing the current supply unit. The interlock circuit ensures that no dangerous voltages are present if the switch cabinet is opened or if a current supply module is disconnected at either the input or output side. Typically, one or more contactors (or "relays") are driven by an auxiliary voltage, such that during normal operation the contactors are closed and the current supply modules are supplied with the line voltage. If the auxiliary voltage is interrupted, the contactors open and disconnect the current supply modules from all dangerous voltages and also prevent a current supply module from producing dangerous voltages.

The auxiliary voltage is looped over all relevant plug contacts and door opening switches, such that if one of the plug contacts or the switch cabinet are opened the auxiliary voltage is interrupted. The wiring of the auxiliary voltage is arranged such that, if one of the contacts on the output side of a current supply module of a current supply unit is opened, all the current supply modules of that current supply unit are disconnected from the power line supply. However, the remaining current supply modules of other current supply units are not disconnected from the power line supply. Thus, if the current supply units and their constituent current supply modules are rearranged, the leads of the interlock circuit have to be individually linked again, which is a time-consuming process and one in which mistakes are easily made.

SUMMARY

A current supply system including separate current supply units, each having one or more current supply modules is provided. The current supply system is easily configured and reconfigured for different purposes. The easy configurability of the current supply unit can also be achieved and facilitated by using current supply modules that are constructed substantially identically.

In a first general aspect, a current supply system includes a plurality of current supply modules that each includes an input terminal and an output terminal and that each have a maximum output power. Multiple current supply modules are electrically combined to form a current supply unit having a maximum output power that is greater than the maximum output power of the individual current supply modules, and a control unit is connected to the current supply unit. A data connection connects the control unit to all the current supply modules of the current supply unit.

In another general aspect, a method of providing an electrical current includes providing a plurality of current supply modules that each includes an input terminal and an output terminal and that each has a maximum output power. An electrical connection is established between multiple current supply modules to form a current supply unit having a maximum output power that is greater than the maximum output power of the individual current supply modules. The current supply unit is controlled with a control unit, and the current supplied by each current supply module is controlled through a data connection that connects the control unit to all the current supply modules of the current supply unit.

Implementations may include one or more of the following features. For example, the current supply system can be a plasma plant current supply system, and the current supply modules can be power converters. The maximum output power of all the current supply modules can be substantially the same.

Furthermore, a plurality of first current supply systems can be electrically combined to form a first current supply unit having a first maximum power output, and a plurality of second current supply systems can be electrically combined to form a second current supply unit having a second maximum power output different from the first maximum power output. Each current supply module can include a receptacle for receiving the control unit, and exactly one current supply module of each current supply unit receive the control unit.

Additionally, the current supply module that receives the control unit or the control unit itself can be adapted for connection to an external controller, and the external controller can a computer. Each current supply module can include a measuring device for measuring a current supply module output quantity, and the output quantity can be selected from the group consisting of a voltage, a current, and a power. Each measuring device can include a signal matching circuit for converting a voltage, a voltage/current converter for converting the output voltage of the signal matching circuit into a current, and an apparent ohmic resistance for generating a voltage drop. The measuring signals of the current supply modules can be supplied to the current supply unit of the control unit in parallel via the data connection.

Still further, the current supply system can be disposed in a switching cabinet, and the current supply modules can be current sources. The current supply system can further include an interlock circuit for the current supply unit, where the interlock circuit is adapted for connection to the current supply modules of the current supply unit. The current supply system can include a common input electrical conductor for electrically connecting the current supply modules of the current supply unit at the output side and a common output electrical connector that electrically connects the output terminals of two neighboring current supply modules. Two or more, or all of the, current supply modules of the current supply unit can be electrically connected at the input side. The common input electrical conductor can be identical to the common output electrical conductor. The input terminal can include a plurality of connectors that correspond to a number of phases of a power line connection, and the output terminal includes two connectors, which are disposed in different conductor planes, and through which the conductors may be connected to corresponding connectors of neighboring current supply modules. The current supply system can further include insulative distribution elements for connecting the conductors with the terminals, where the distribution elements each comprise receptacles for receiving ends of the conductors.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
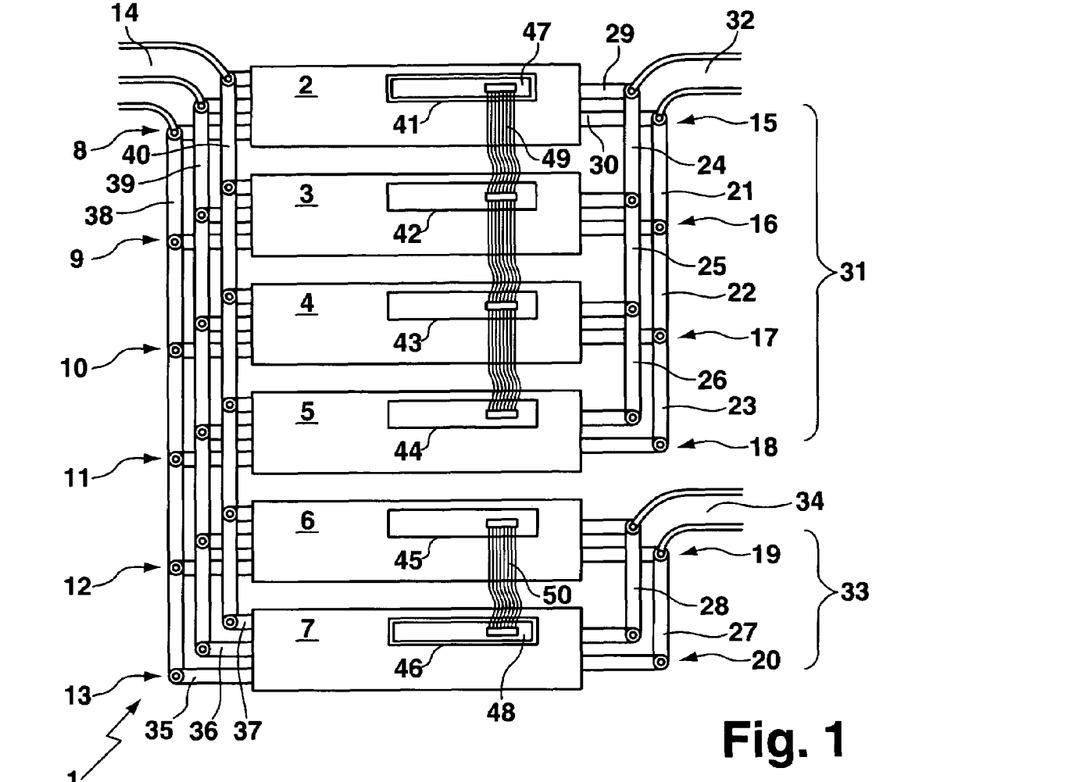
FIG. 1 is a schematic diagram of a current supply system with six current supply modules that are combined into two current supply units.

Referring to FIG. 1, a plasma plant current supply system 1 includes six identically constructed current supply modules 2-7 (e.g., power converters), which are mutually disposed at the same distance from one another. The current supply modules 2-7 each include a terminal 8-13 at the input side, by means of which they are connected to a power line connection 14, and a terminal 15-20 at the output side. At the output side, the terminals 15-18 as well as the terminals 18 and 19 are connected by identical conductors 21-28 embodied as conductor rails. The terminals 15-20 each consist of two connecting pieces 29, 30. The conductors 21-28 each connect corresponding connecting pieces 29, 30 of neighboring current supply modules 2-7.

The current supply modules 2-5 make up a current supply unit 31, whose output side may be connected to a first plasma load, which is indicated by the connection lead 32. The current supply modules 6, 7 make up a current supply unit 33 as well, whose output side may be connected to a second plasma load, which is indicated by the connection lead 34. The connectors 29, 30 can be cables having a common plug for connecting with the conductors 21-28. The terminals 8-13 at the input side of a current supply module 2-7 consist of three connectors 35, 36, and 37, wherein one connector 35-37 is provided, respectively, for each phase of the line power.

Analogous to the terminals at the output side, the corresponding connectors 35-37 of the terminals 8-13 at the input side of neighboring current supply modules 2-7 are connected by identical conductors 38-40, wherein only conductors which connect the current supply modules 2 and 3 at the input side are provided with reference numerals. The conductors 21-28 and 38-40 have the same length, such that the same conductors are used at the input and output side. By displacing and/or rearranging connections between the conductors 21-28, 38-40 at the input and/or output side, other configurations of the plasma plant current supply system 1, in particular other configurations of current supply units 31, 33, can be created.

Each current supply module 2-7 includes a receptacle 41-46 (e.g., a plug-in slot), into which a control unit 47, 48 may be plugged. A shaft that holds the control unit 47, 48, as well as a plug-in connection (e.g., an interface) into which the control unit can be plugged, as well as any other structure allowing a connection of the control 47, 48 unit with the current supply module 2-7, are considered as the receptacle 41-46. By plugging a control unit 47, 48 into a current supply module 2, 7, the current supply module becomes a master current supply module 2, 7 of a current supply unit 31, 33. The master current supply modules 2, 7 are connected to the other (slave) current supply modules 3-5 and 6 of their current supply unit 31, 33 by ribbon cable data connections 49, 50, which act as a bus. Master current supply modules 2, 7 can receive measuring signals from these slave current supply modules 3-5 and 6. Control signals are transmitted to the slave current supply modules 3-5 or 6 from the master current supply modules 2, 7 through the data connections 49, 50. Because each current supply module 2-7 can receive the control unit 47, 48, each current supply module 2-7 may be made into the master current supply module of the current supply unit.

Control units 47, 48 can be connected to an external controller (e.g., a process computer). The external controller can take over the primary control of one or several current supply units 31, 33, while the control unit 47, 48 unit takes over the control of the individual current supply modules 2-7. Because only one control unit 47, 48 is provided per current supply unit 31, 33, only one connection to the external controller must be established per current supply unit 31, 33 when reconfiguring the current supply system 1, and each control unit 47, 48 does not have to be connected to the external controller.

Figure 2:
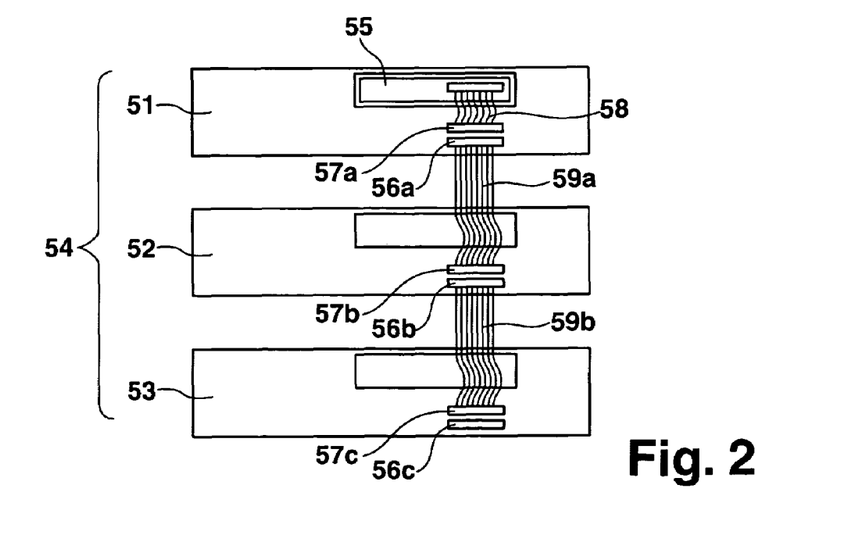
FIG. 2 is a schematic diagram of a data connection between control units of the current supply modules of FIG. 1.

Referring to FIG. 2 data connection 59 connects current supply modules 51-53 of a current supply unit 54 with a control unit 55. Each current supply module 51-53 includes a data input connector 56a, 56b, 56c and a data output connector 57a, 57b, 57c. The data output 57a of the master current supply module 51 is connected to the control unit 55 by a ribbon cable data connection 58. The data input 56a of the master current supply module 51 is connected to the output 57b of the neighboring current supply module 52 by the data connection 59a. The data input 56b is, again, connected to the data output 57c of the current supply module 53 by data connection 59b. The measuring signals of the current supply module 53 are transmitted to the control unit 55 by the current supply modules 51, 52. This embodiment allows using the same data connections 59a, 59b independent from the number of current supply modules 51-53 combined in the unit 54. Thus, the concept of the flexible, modular construction of the current supply system is further improved. The use of separate data inputs and outputs allows an easy coding and detection of the number of current supply modules 51-53 connected to the control unit 55. With data connections 58, 59a, 59b, analog and digital data may be transmitted. In particular, an auxiliary voltage may be supplied to the current supply modules 51-53 therewith.

Figure 3:
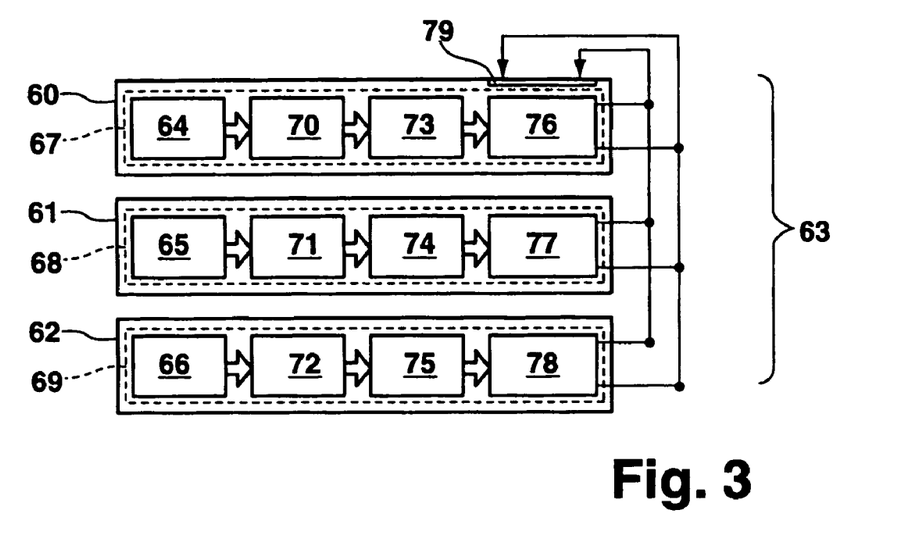
FIG. 3 is a schematic diagram of a measurement connection of measuring units of the current supply modules in a current supply unit.

FIG. 3 shows a schematic arrangement for a combined measurement of the current supply modules 60-62 using the example of three current supply modules 60-62 of a current supply unit 63. Current supply modules 60-62 can include measuring devices 67-69 for measuring one or several output quantities such as voltage, current, and/or power. The measured output quantities can be supplied to the control unit 55 by the data connections 58, 59. The control unit evaluates the quantities and controls the individual current supply modules to obtain a given output power, or switches the individual current supply modules 60-62 off when a malfunction is detected.

In all three current supply modules 60-62, an analog output quantity is measured in a measuring component 64-66 of a measuring device 67-69, and, if necessary (e.g., depending on the measured output quantity), converted into a voltage. In a signal matching circuit 70-72, the voltage of the measuring components 64-66 is transformed into a lower voltage and thus reduced (e.g., by a factor of 10). A voltage/current converter 73-75 is supplied with the transformed voltage, wherein, for example, 10 V are converted into 20 mA. The current is then supplied to an apparent ohmic resistances 76-78 (e.g., 500 Ohms), whereby a voltage drop occurs at the respective apparent ohmic resistances 76-78. The voltage drops over the apparent ohmic resistances 76-78 are supplied to an input stage of a control unit 79 in parallel, where they are evaluated. The input stage of the control unit 79 includes an analog-to-digital converter. The control unit 79 is disposed in the current supply module 60, such that the current supply module 60 is the master current supply module.

The measuring devices 67-69, consisting of measuring components 64-66, signal matching circuit 70-72, voltage/current converter 73-75, and apparent ohmic resistance 76-78, are provided in each current supply module 60-62 several times, in particular for each output quantity to be measured. Since the voltage drops over the apparent ohmic resistances are supplied to the control unit 79 in parallel, the voltage drops are averaged. The measuring range of the control unit 79 is therefore independent of the number of current supply modules 60-62 in a current supply unit 63. Analog measuring signals may be generated from these measurements and passed to the control unit 79, whereby a faster closed-loop and open-loop control is possible. If necessary, a circuit that converts the measured output quantity into a voltage is provided upstream from the signal matching means for voltage conversion.

The measuring signals of the current supply modules 60-62 may be supplied to a current supply unit of the control unit 79 in parallel via the data connection (e.g., over a common bus). The analog measuring signals can be supplied to the control unit 79 by a ribbon cable that acts as a bus. By this measurement technique the measuring signals are essentially averaged, such that the measuring value for a particular output quantity received by the control unit is independent from the number of current supply modules in the current supply unit and is always in the same range. After reconfiguration of the individual current supply units 60-62 of the current supply system 1, therefore, a calibration is not necessary.

Figure 4:
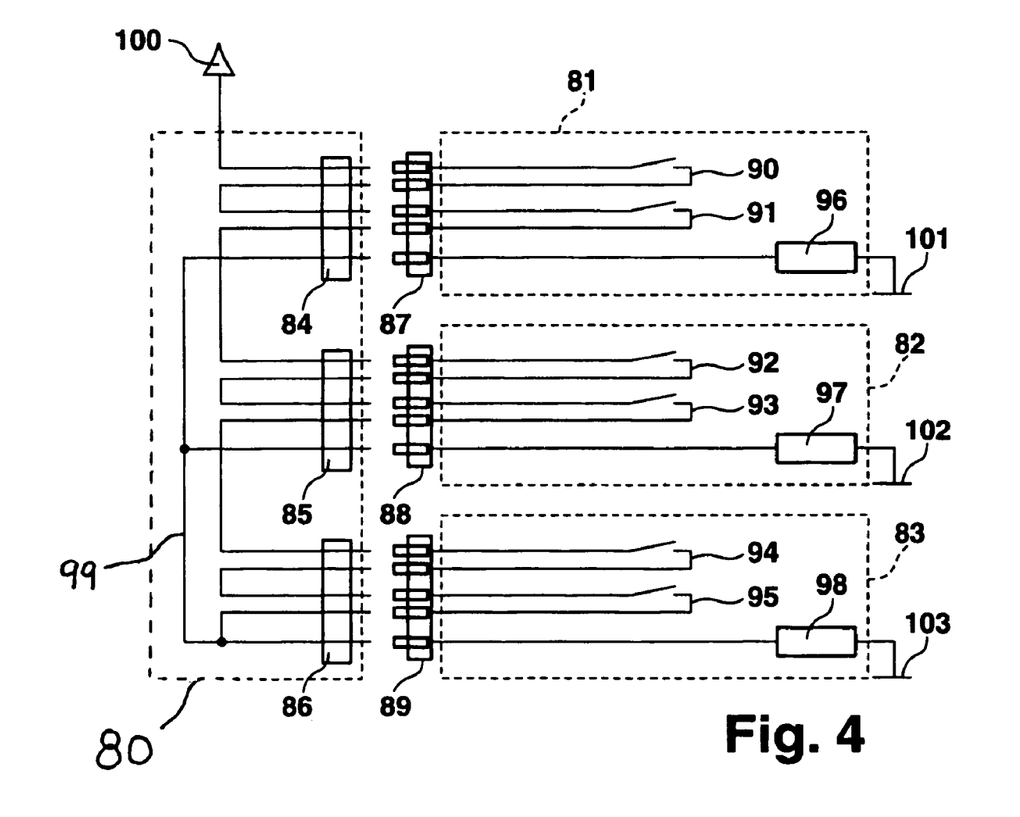
FIG. 4 is a schematic diagram of an interlock circuit of the plasma plant current supply system.

FIG. 4 shows is a schematic view of an interlock unit 80 of an interlock circuit, in which each current supply unit consisting of several current supply modules is allocated one interlock unit 80. A current supply unit is made up of one or more current supply modules 81-83. The interlock unit 80 includes several connectors 84-86, into which corresponding plugs 87-89 of the current supply modules 81-83 may be plugged. The plug connections can be D-SUB connectors. The connectors 87-89 are each connected with breaker contacts 90-95 of their respective current supply module and with a contactor 96-98, wherein the contactors 96-98 are connected with the wiring 99 of the interlock unit 80 if the plugs 87-89 are plugged in. The breaker contacts 90-95 are provided in the terminals at the input side and the output side of the current supply modules. They are closed if the terminals are connected with the line voltage or with a load.

At reference numeral 100 an auxiliary voltage is applied. During normal operation a current flows through the wiring 99 of the interlock unit 80 and the wiring of the current supply modules 81-83, wherein the breaker contacts 90-95 are closed. As soon as the electrical connection between 100 and ground 101-103 is interrupted, one of the contactors 96-98 opens, whereby the current supply unit is disconnected from the line voltage. For example, the electrical connection is interrupted if a breaker contact 90-95 is opened (i.e., a terminal of a current supply module 81-83 of the current supply unit is disconnected). If fewer current supply modules 81-83 are connected to the interlock unit 80 than there are connectors 84-86, the contacts of the free connectors 84-86 not occupied can be short-circuited in pairs.

An interlock circuit is provided for each current supply unit, to which interlock circuit the current supply modules of a current supply unit may be connected. To avoid the individual rewiring of the interlock circuit when changing the configuration of a current supply unit, each current supply unit is allocated an interlock unit with defined wiring, and each current supply module of the current supply unit, with defined wiring for its part, is connected to the interlock circuit, wherein the entire current supply unit is disconnected from the line voltage if the auxiliary voltage is interrupted in one current supply module. Connection of the interlock unit to a current supply module is preferably realized by means of a plug contact. Thus, the interlock circuit of a current supply unit may be easily configured by plugging the plugs of the individual current supply modules into the interlock unit. The described interlock circuit is also considered an independent invention.

Figure 5:
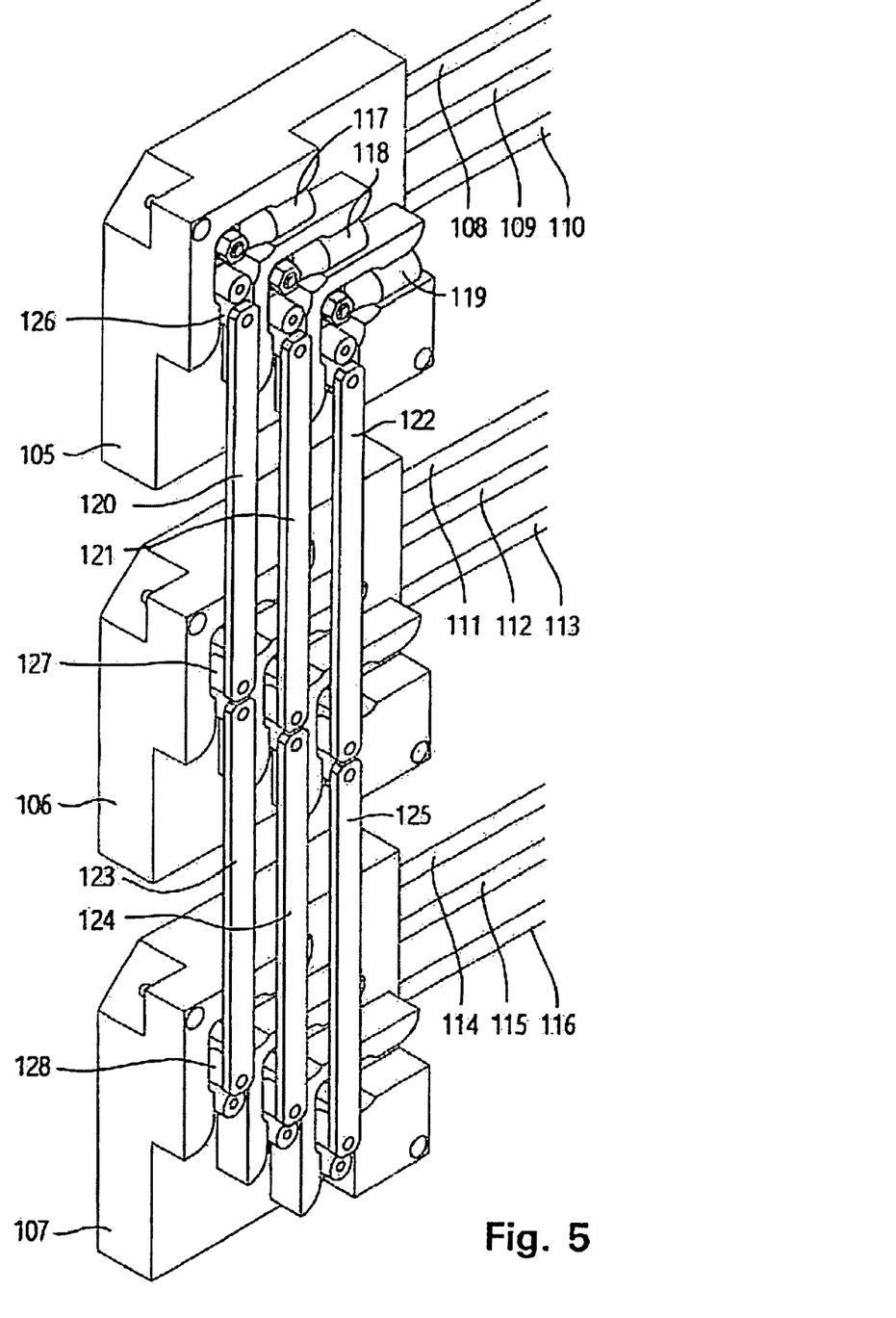
FIG. 5 is a perspective view of distribution elements of the current supply system.

In FIG. 5 distribution elements 105-107 made of insulating material are shown in a perspective view. Connection leads 108-116 from power switches (not shown) preceding the current supply modules are fed to the distribution elements 105-107 laterally from behind, wherein the connecting elements 108-110 are allocated to a first current supply module, the connecting elements 111-113 are allocated to a second current supply module, and the connecting elements 114-116 are allocated to a third current supply module. The connecting elements 108-110, 111-113, and 114-116 may be combined in a plug. The distribution element 105 includes lead terminals 117-119 for connecting three phases of an input line voltage. The lead terminals 117-119 are electrically isolated from one another by means of webs of the distribution element 105. The distribution elements 105 and 106 are connected by three parallel conductors 120-122, e.g., embodied as conductor rails, and the distribution elements 106 and 107 are connected by the conductors 123-125. The conductors 120-125 are attached with their ends to conductor receptacles 126-128 by fasteners (e.g., screws). The position of the conductors 120-125 is fixed by the receptacles 126-128, thus achieving an electrical connection to the respective allocated connection piece 108-116, as well as to an aligned conductor 120-125. Thus, each conductor end is allocated a conductor receptacle 126-128, such that aligned conductors 120, 123, do not overlap.

A connection between conductor and current supply module can be realized particularly quickly and easily by means of these distribution elements, whereby the flexibility of the current supply system is further increased. The facilitated configuration and reconfiguration of a plasma plant current supply system is also achieved by the distribution elements only.

Thus, in a current supply system (e.g., a plasma plant current supply system) with several identically constructed current supply modules 2-7, 51-53, 60-62, 81-83 (e.g., power converters), which each include input and output terminals 8-13, 15-20, the current supply modules 2-7, 51-53, 60-62, 81-83 can be combined into current supply units 31, 33, 54, 63 having different output powers. A single control unit 47, 48, 55, 79 can be provided for each current supply unit 31, 33, 54, 63, and the control unit 47, 48, 55, 79 can be connected to all current supply modules 2-7, 51-53, 60-62, 81-83 of the current supply unit 31, 33, 54, 63 by means of a data connection. Thus, different configurations of the current supply system may be achieved with few different components.

The current supply system 1 can be disposed in a switching cabinet. Several current supply modules 2-7 can be disposed in the switching cabinet and be configured into different current supply units 31, 33, depending on the requirement of the user.

The current supply modules 2-7 show a current source characteristic. Thus, the current supply modules of a current supply unit can be connected in parallel at the output side. Furthermore, two or more current supply modules of a current supply unit can be connected at the input side. Current supply modules connected to one another can be switched on and off via a common switch. In particular, all current supply modules of a current supply unit can have a common power line connection. However, it is also conceivable that each current supply module has its own power line connection.

If all current supply modules are connected at the input side, all the current supply modules can be switched on and off via a common switch, and only one power line connection is necessary. Thereby, the terminals at the input side may be connected to common continuous conductors, in particular conductor rails.

Identical conductors are provided for connection at the input side as well as for the connection at the output side. If the current supply modules are disposed on top of one another or next to one another, the terminals at the input and at the output have the same distance, such that neighboring current supply modules can be connected at the input side with the same conductors as at the output side. The number of different parts is therefore further reduced and the new configuration of the plasma plant current supply system is facilitated.

The input terminal includes a number of connection pieces corresponding to the number of phases of the power line connection, and the output terminal includes two connection pieces, which may be connected to corresponding connection pieces of neighboring current supply modules by means of the conductors. Thus, short-circuiting is avoided. Furthermore, an arrangement is achieved that is easy to survey and comprehend, such that few, if any, mistakes are made in configuring current supply units.

The easy configurability of the plasma plant current supply system is also achieved in that exclusively identical conductors, in particular conductor rails, are provided for connecting the current supply modules of a current supply unit at the output side, wherein the electrical conductors electrically connect the output terminals of two neighboring current supply modules, respectively. The configuration of a current supply unit may easily be changed by rearranging the conductors. If the current supply modules are suitably arranged, identical conductors, particularly of identical dimension (e.g., same length, width, diameter, electrical resistance) can be used for connecting the current supply modules. Therefore, only few different parts are necessary for a configuration or reconfiguration of current supply units.

OTHER EMBODIMENTS

A number of embodiments of the invention have been described. Nevertheless, it will be understood that various modifications may be made. Accordingly, other embodiments are within the scope of the following claims.

What is claimed is:

1. A current supply system for a plasma gas discharge application, the current supply system comprising one or more current supply units each comprising:
    a plurality of separate and distinct current supply modules each having an input terminal, an output terminal, and its own control receptacle, the current supply modules connected such that each current supply unit has a single output connection that provides a maximum output power that is greater than the maximum output power of its individual current supply modules;
    a control unit plugged into the control receptacle of a first of the current supply modules, and movable to any of the control receptacles of the other current supply modules of the current supply unit; and
    a data connection connecting all the current supply modules of the current supply unit to the control unit such that the control unit is able to control all of the current supply modules of the current supply unit through connection to any one control receptacle of the current supply modules of the current supply unit.

2. The current supply system of claim 1, wherein the current supply modules are power converters.

3. The current supply system of claim 1, wherein the maximum output power of all the current supply modules is substantially the same.

4. The current supply system of claim 1, wherein a plurality of first current supply systems are electrically combined to form a first current supply unit having a first maximum power output and a plurality of second current supply systems are electrically combined to form a second current supply unit having a second maximum power output different from the first maximum power output.

5. The current supply system of claim 1, wherein a control receptacle receives the control unit, and wherein exactly one current supply module of each current supply unit receives the control unit.

6. The current supply system of claim 5, wherein the current supply module that receives the control unit is adapted for connection to an external controller.

7. The current supply system of claim 6, wherein the external controller is a computer.

8. The current supply system of claim 5, wherein the control unit is adapted for connection to an external controller.

9. The current supply system of claim 8, wherein the external controller is a computer.

10. The current supply system of claim 1, wherein each current supply module includes a measuring device for measuring a current supply module output quantity.

11. The current supply system of claim 10, wherein the output quantity is selected from the group consisting of a voltage, a current, and a power.

12. The current supply system of claim 10, wherein each measuring device includes a measuring component for measuring an analog output quantity and converting the analog output quantity into a voltage, a signal matching circuit for converting the voltage from the respective measuring component, a voltage/current converter for converting the output voltage of the signal matching circuit into a current, and a resistor for generating a voltage drop.

13. The current supply system of claim 1, wherein the current supply system is disposed in a switching cabinet.

14. The current supply system of claim 1, wherein the current supply modules are current sources.

15. The current supply system of claim 1, further comprising an interlock circuit for the current supply unit, wherein the interlock circuit is adapted for connection to the current supply modules of the current supply unit.

16. The current supply system of claim 1, further comprising:
    an output electrical conductor for electrically connecting the current supply modules of the current supply unit at an output side;
    wherein the output electrical conductor electrically connects the output terminals of two neighboring current supply modules.

17. The current supply system of claim 16, wherein two or more current supply modules of the current supply unit are electrically connected at an input side.

18. The current supply system of claim 17, wherein all the current supply modules are electrically connected at the input side.

19. The current supply system of claim 16, further comprising an input electrical conductor that is identical in construction to the output electrical conductor.

20. The current supply system of claim 16, wherein the output electrical conductor is a conductor rail.

21. The current supply system of claim 1, wherein the control unit and the first current supply module form a master current supply module that includes a connection between the control unit and the first current supply module for controlling the first current supply module through the control unit, and the control unit when moved to another of the control receptacles of the other current supply modules of the current supply unit forms a master current supply module with that current supply module.

22. A current supply system for a plasma gas discharge application, the current supply system comprising one or more current supply units each comprising:
    a plurality of current supply modules each having an input terminal, an output terminal, and a control receptacle, the current supply modules connected such that each current supply unit has a maximum output power that is greater than the maximum output power of its individual current supply modules;
    a control unit connected to one of the control receptacles and movable to any of the control receptacles of the other current supply modules of the current supply unit; and
    a data connection connecting all the current supply modules of the current supply unit to the control unit such that the control unit is able to control all of the current supply modules of the current supply unit through connection to any one control receptacle of the current supply modules of the current supply unit, wherein each current supply module includes a measuring device for measuring a current supply module output quantity and wherein measuring signals of the current supply modules are supplied to the control unit of the current supply unit in parallel via the data connection.

23. A current supply system for a plasma gas discharge application, the current supply system comprising one or more current supply units each comprising:
    a plurality of current supply modules each having an input terminal, an output terminal, and a control receptacle, the current supply modules connected such that each current supply unit has a maximum output power that is greater than the maximum output power of its individual current supply modules;
    a control unit connected to one of the control receptacles and movable to any of the control receptacles of the other current supply modules of the current supply unit;
    a data connection connecting all the current supply modules of the current supply unit to the control unit such that the control unit is able to control all of the current supply modules of the current supply unit through connection to any one control receptacle of the current supply modules of the current supply unit; and
    an output electrical conductor for electrically connecting the current supply modules of the current supply unit at an output side,
    wherein the output electrical conductor electrically connects the output terminals of two neighboring current supply modules and wherein the input terminal includes a plurality of connectors that correspond to a number of phases of a power line connection, and the output terminal includes two connectors, which are disposed in different conductor planes, and through which the conductors may be connected to corresponding connectors of neighboring current supply modules.

24. A current supply system for a plasma gas discharge application, the current supply system comprising one or more current supply units each comprising:
    a plurality of current supply modules each having an input terminal, an output terminal, and a control receptacle, the current supply modules connected such that each current supply unit has a maximum output power that is greater than the maximum output power of its individual current supply modules;
    a control unit connected to one of the control receptacles and movable to any of the control receptacles of the other current supply modules of the current supply unit;
    a data connection connecting all the current supply modules of the current supply unit to the control unit such that the control unit is able to control all of the current supply modules of the current supply unit through connection to any one control receptacle of the current supply modules of the current supply unit;
    an output electrical conductor for electrically connecting the current supply modules of the current supply unit at an output side; wherein the output electrical conductor electrically connects the output terminals of two neighboring current supply modules; and
    insulative distribution elements for connecting the conductors with the terminals, wherein the distribution elements each comprise receptacles for receiving ends of the conductors.

25. A current supply system for a plasma gas discharge application, the current supply system comprising one or more current supply units each comprising:
    a plurality of substantially similar, separate, and distinct power converter modules having an input terminal, an output terminal, and its own control receptacle, the power converter modules connected such that each current supply unit has a single output connection that provides a maximum output power that is greater than the maximum output power of its individual power converter modules;
a control unit plugged into the control receptacle of a first of the current supply modules, and movable to any of the control receptacles of the other current supply modules of the current supply unit; and
a data connection connecting all the power converter modules of the current supply unit to the control unit such that the control unit is able to control all of the power converter modules of the current supply unit through connection to any one control receptacle of the power converter modules of the current supply unit; and
an output electrical conductor for electrically connecting the power converter modules of the current supply unit at an output side,
wherein the output electrical conductor electrically connects the output terminals of two neighboring power converter modules.

26. The current supply system of claim 25, wherein a plurality of first current supply systems are electrically combined to form a first current supply unit having a first maximum power output and a plurality of second current supply systems are electrically combined to form a second current supply unit having a second maximum power output different from the first maximum power output.

27. The current supply system of claim 25, wherein the control receptacle receives the control unit, and wherein exactly one power converter module of each current supply unit receives the control unit.

28. The current supply system of claim 27, wherein the power converter module that receives the control unit is adapted for connection to an external controller.

29. The current supply system of claim 28, wherein the external controller is a computer.

30. The current supply system of claim 27, wherein the control unit is adapted for connection to an external controller.

31. The current supply system of claim 30, wherein the external controller is a computer.

32. The current supply system of claim 25, wherein each power converter module includes a measuring device for measuring a power converter module output quantity.

33. The current supply system of claim 32, wherein the output quantity is selected from the group consisting of a voltage, a current, and a power.

34. The current supply system of claim 32, wherein each measuring device includes a measuring component for measuring an analog output quantity and converting the analog output quantity into a voltage, a signal matching circuit for converting the voltage from the respective measuring component, a voltage/current converter for converting the output voltage of the signal matching circuit into a current, and a resistor for generating a voltage drop.

35. The current supply system of claim 25, wherein the current supply system is disposed in a switching cabinet.

36. The current supply system of claim 25, further comprising an interlock circuit for the current supply unit, wherein the interlock circuit is adapted for connection to the power converter modules of the current supply unit.

37. The current supply system of claim 25, wherein two or more power converter modules of the current supply unit are electrically connected at an input side.

38. The current supply system of claim 37, wherein all the power converter modules are electrically connected at the input side by an input electrical conductor that is identical in construction with the output electrical conductor.

39. The current supply system of claim 25, further comprising an input electrical conductor that is identical in construction to the output electrical conductor.

40. The current supply system of claim 25, wherein the output electrical conductor is a conductor rail.

41. A current supply system for a plasma gas discharge application, the current supply system comprising one or more current supply units each comprising:
a plurality of substantially similar power converter modules having an input terminal, an output terminal, and a control receptacle, the power converter modules connected such that each current supply unit has a maximum output power that is greater than the maximum output power of its individual power converter modules;
a control unit connected to one of the control receptacles and movable to any of the control receptacles of the other power converter modules of the current supply unit;
a data connection connecting all the power converter modules of the current supply unit to the control unit such that the control unit is able to control all of the power converter modules of the current supply unit through connection to any one control receptacle of the power converter modules of the current supply unit; and
an output electrical conductor for electrically connecting the power converter modules of the current supply unit at an output side;
wherein the output electrical conductor electrically connects the output terminals of two neighboring power converter modules, wherein each power converter module includes a measuring device for measuring a power converter module output quantity and wherein the measuring signals of the power converter modules are supplied to the control unit of the current supply unit in parallel via the data connection.

42. A current supply system for a plasma gas discharge application, the current supply system comprising one or more current supply units each comprising:
a plurality of substantially similar power converter modules having an input terminal, an output terminal, and a control receptacle, the power converter modules connected such that each current supply unit has a maximum output power that is greater than the maximum output power of its individual power converter modules;
a control unit connected to one of the control receptacles and movable to any of the control receptacles of the other power converter modules of the current supply unit;
a data connection connecting all the power converter modules of the current supply unit to the control unit such that the control unit is able to control all of the power converter modules of the current supply unit through connection to any one control receptacle of the power converter modules of the current supply unit; and
an output electrical conductor for electrically connecting the power converter modules of the current supply unit at an output side,
wherein the output electrical conductor electrically connects the output terminals of two neighboring power converter modules and wherein the input terminal includes a plurality of connectors that correspond to a number of phases of a power line connection, and the output terminal includes two connectors, which are disposed in different conductor planes, and through which the conductors may be connected to corresponding connectors of neighboring power converter modules.

43. A current supply system for a plasma gas discharge application, the current supply system comprising one or more current supply units each comprising:

a plurality of substantially similar power converter modules having an input terminal, an output terminal, and a control receptacle, the power converter modules connected such that each current supply unit has a maximum output power that is greater than the maximum output power of its individual power converter modules;

a control unit connected to one of the control receptacles and movable to any of the control receptacles of the other power converter modules of the current supply unit;

a data connection connecting all the power converter modules of the current supply unit to the control unit such that the control unit is able to control all of the power converter modules of the current supply unit through connection to any one control receptacle of the power converter modules of the current supply unit;

an output electrical conductor for electrically connecting the power converter modules of the current supply unit at an output side; wherein the output electrical conductor electrically connects the output terminals of two neighboring power converter modules; and insulative distribution elements for connecting the conductors with the terminals, wherein the distribution elements each comprise receptacles for receiving ends of the conductors.

44. A method of providing an electrical current to a plasma gas discharge application, the method comprising:

providing one or more separate and distinct current supply units each comprising a plurality of current supply modules each having an input terminal, an output terminal, and its own control receptacle, each current supply module has a maximum output power;

establishing an electrical connection between the current supply modules of the current supply unit such that each current supply unit has a single output connection that provides a maximum output power that is greater than the maximum output power of its individual current supply modules;

plugging a control unit into the control receptacle of a first of the current supply modules, wherein the control unit is movable to any of the control receptacles of the other current supply modules of the current supply unit;

controlling the current supply unit with the control unit;

connecting all of the current supply modules of the current supply unit to the control unit such that the control unit is able to control all of the current supply modules of the current supply unit through connection to any one control receptacle of the current supply modules of the current supply unit; and outputting the output power of the current supply unit.

45. The method of claim 44, further comprising:

establishing an electrical connection between multiple first current supply modules to form a first current supply unit having a first maximum power output; and establishing an electrical connection between multiple second current supply modules to form a second current supply unit having a second maximum power output different from the first maximum power output.

46. The method of claim 45, further comprising reconfiguring the established electrical connection between the multiple first current supply modules to form the first current supply unit having another first maximum power output that is different from the first maximum power output.

47. The method of claim 46, wherein reconfiguring comprises changing the electrical connection between the multiple first current supply modules.

48. The method of claim 44, further comprising inserting the control unit into only one of the current supply modules.

49. The method of claim 44, further comprising inserting the control unit into the control receptacle of a current supply module.

50. The method of claim 44, further comprising electrically connecting two neighboring current supply modules of the current supply unit at an output side with an output electrical conductor.

51. The method of claim 50, further comprising electrically connecting two neighboring current supply modules of the current supply unit at an input side with an input electrical conductor.

* * * * *